US012796369B2

(12) United States Patent
Liao et al.

(10) Patent No.: US 12,796,369 B2
(45) Date of Patent: Nov. 10, 2026

(54) AUTO RECIPE GENERATION AND DICING PROCESS

(71) Applicant: Taiwan Semiconductor Manufacturing Co., Ltd., Hsinchu (TW)

(72) Inventors: Jen-Chun Liao, Taipei City (TW); Chih-Wei Lin, Zhubei City (TW); Ching-Hua Hsieh, Hsinchu (TW); Wen-Chih Chiou, Zhunan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 426 days.

(21) Appl. No.: 18/489,994

(22) Filed: Oct. 19, 2023

(65) Prior Publication Data

US 2024/0429101 A1 Dec. 26, 2024

Related U.S. Application Data

(60) Provisional application No. 63/509,805, filed on Jun. 23, 2023.

(51) Int. Cl.
*H10P 54/00* (2026.01)
*H10P 74/20* (2026.01)

(52) U.S. Cl.
CPC ............ *H10P 54/00* (2026.01); *H10P 74/203* (2026.01)

(58) Field of Classification Search
USPC .......................................................... 700/109
See application file for complete search history.

(56) References Cited

U.S. PATENT DOCUMENTS 4,870,288 A * 9/1989 Abuku ...................... G03F 9/70 250/548
6,421,456 B1 * 7/2002 Son ..................... H10P 72/0614 257/E23.179

(Continued)

FOREIGN PATENT DOCUMENTS

TW 202015212 A 4/2020
TW 202238688 A 10/2022

OTHER PUBLICATIONS

Chen, F., et al.. "Automated vision positioning system for dicing semiconductor chips using improved template matching method", published Oct. 19, 2018. Retrieved from https://link.springer.com/article/10.1007/s00170-018-2845-5. Accessed Jan. 26, 2026. (Year: 2018).*

(Continued)

*Primary Examiner* — Mark A Connolly
*Assistant Examiner* — Michael V Farina
(74) *Attorney, Agent, or Firm* — Slater Matsil, LLP

(57) ABSTRACT

A method includes forming a database, finding a plurality of dicing marks on a wafer, wherein patterns of the plurality of dicing marks match a pattern in the database, measuring a die pitch of the wafer according to a pitch of adjacent two of the plurality of dicing marks, and determining kerf centers of the wafer based on the plurality of dicing marks. The measuring the die pitch and the determining the kerf centers are performed on a same wafer-holding platform. The wafer is diced into a plurality of dies, and the dicing is performed aligning to the kerf centers.

20 Claims, 13 Drawing Sheets

(56) References Cited

U.S. PATENT DOCUMENTS

| | | | | |
|---|---|---|---|---|
| 10,643,951 | B2 | 5/2020 | Peng et al. | |
| 12,033,902 | B2 | 7/2024 | Hsieh et al. | |
| 2002/0042153 | A1* | 4/2002 | Holcman | H10P 74/277<br>438/462 |
| 2015/0087088 | A1* | 3/2015 | Fujimori | H10F 39/804<br>438/15 |
| 2017/0148700 | A1* | 5/2017 | Narita | H10W 74/137 |
| 2018/0233410 | A1* | 8/2018 | James | H10P 54/00 |
| 2022/0288738 | A1* | 9/2022 | Takagi | H10P 72/53 |

OTHER PUBLICATIONS

Wang, Y., et al.. "An automatic detection method for cutting path of chips in a wafer", published Dec. 26, 2022. Retrieved from https://www.mdpi.com/2072-666X/14/1/59. Accessed on Jan. 26, 2026 (Year: 2022).*

Buera, M. V. S., et al.. "Pattern recognition system program advancement to compensate strip expansion on 1-map strips" published May 21, 2021. Retrieved from https://journaljerr.com/index.php/JERR/article/view/481/963. Accessed on Jan. 27, 2026 (Year: 2021).*

* cited by examiner

NTO - Template Name - Part Name - CH1 Pitch - CH2 Pitch - Wafer THK

NTO - OS - TMZX88 - 24005 - 18060 -600 → RD - TMZX88 SAW - V4

NTO - DMY - DUMMY - 14000-3650-775 → RD - DUMMY - 14000X3650-SAW

AUTO RECIPE GENERATION AND DICING PROCESS

PRIORITY CLAIM AND CROSS-REFERENCE

This application claims the benefit of the following provisionally filed U.S. Patent application: Application No. 63/509,805, filed on Jun. 23, 2023, and entitled "Auto Recipe Generation in Dicing process," which application is hereby incorporated herein by reference.

BACKGROUND

The packages of integrated circuits are becoming increasing complex, with more device dies integrated in the same package to achieve more functions. For example, packages may be formed to include a plurality of device dies such as processors and memory cubes in the same package. The packages can include device dies formed using different technologies and have different functions bonded to the same device die, thus forming a system. This may save manufacturing cost and achieve optimized device performance.

In a package, a top die may be bonded to a bottom die through bonding. The top die is a part of a wafer, which is sawed (in a dicing process) into a plurality of identical top dies, so that the top dies may be bonded to the respective underlying package components such as bottom dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
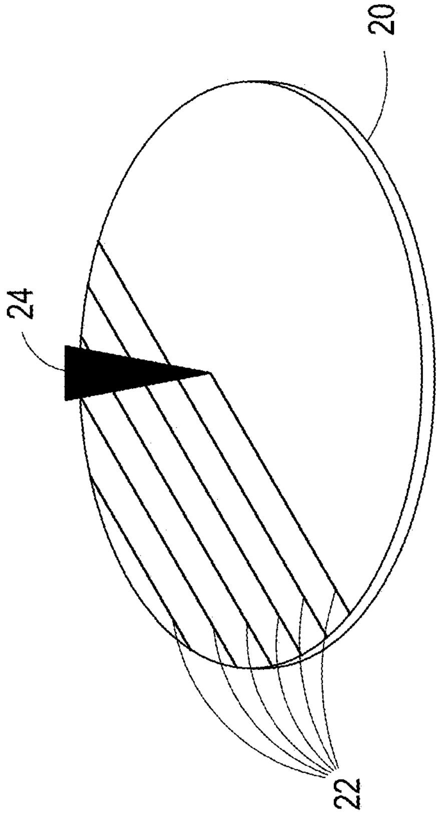
FIGS. 1 and 2 illustrate the dicing of wafers using a laser dicing process and a blade sawing process, respectively in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An automatic wafer measurement process of wafers and automatic wafer dicing process are provided. When a new tape-out is made, wafer dicing (sawing) recipe is built for this type of wafers, and saved in a database, and is used to perform the automatic wafer measurement process. An auto dicing tool is provided to perform the recipe building process and the auto wafer dicing process. In the subsequent dicing of the wafers after the recipe has been built, the data in the database can be retrieved, so that the measurement and the sawing of the same type of wafers may be performed automatically. Through this process, repeated processes in conventional wafer dicing processes are skipped, and the throughput is improved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1 illustrates a perspective view of wafer 20 that is diced in accordance with some embodiments. Wafer 20 may be a device wafer in which integrated circuits are formed. Alternatively, wafer 20 may be a reconstructed wafer, which is formed by dicing device wafers into device dies, and packaging the device dies through packaging processes. The packaging process may include encapsulating the device dies and forming redistribution lines interconnecting the device dies. Wafer 20 may also be a dummy wafer, an interposer wafer (including a semiconductor substrate and through-semiconductor vias), or the like.

The dicing of wafer 20 may be performed through laser beam 24 as schematically illustrated in FIG. 1. The laser beam 24 passes through a plurality of scribe lines, and kerfs 22 are formed in wafer 20 by laser beam 24. FIG. 1 illustrates the kerfs 22 parallel to a first direction. After kerfs are formed in a second direction perpendicular to the first direction, the dies in wafer 20 are separate from each other.

Figure 2:
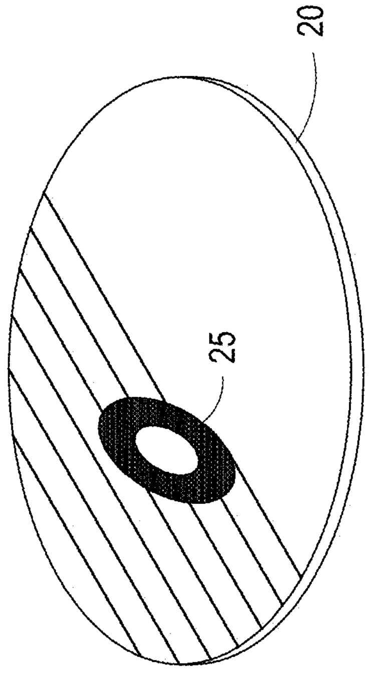

FIG. 2 illustrates a perspective view of wafer 20 that is diced in accordance with alternative embodiments. These embodiments are similar to the embodiments in FIG. 1, except that the dicing is performed using blade 25.

Figure 3:
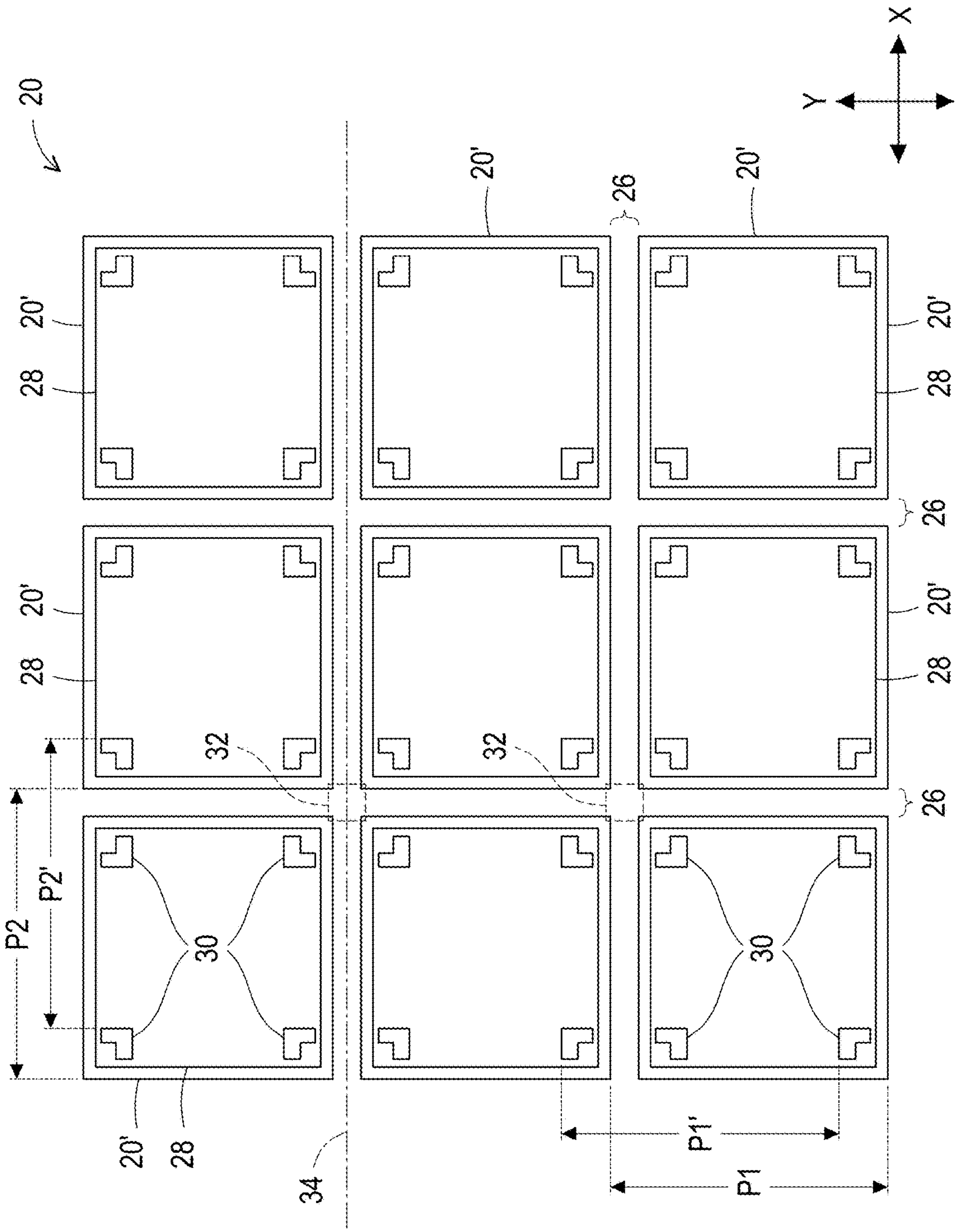
FIG. 3 illustrates a portion of a wafer including dies and scribe lines in accordance with some embodiments.

FIG. 3 illustrates a portion of wafer 20 in accordance with some embodiments. Wafer 20 includes a plurality of dies 20' arranged as a plurality of rows and a plurality of columns. It is appreciated that the concept of rows and columns are relative depending on how the wafer 20 is placed. The plurality of dies 20' are identical to each other. The dies 20' are spaced apart from each other by scribe lines 26. Some of the scribe lines 26 have lengthwise directions in the X-direction, and some other scribe lines 26 have lengthwise directions in the Y-direction.

Throughout the description, the lengthwise directions of the scribe lines are referred to as channel directions, and may be identified as channel 1 (CH1) direction and channel 2 (CH2) direction. The dicing will be performed with the kerfs aligned to the centers of scribe lines 26. Line 34 illustrates a kerf center, which is determined by using the embodiments of the present disclosure. The laser beam 24 (FIG. 1) or blade 25 (FIG. 2) will be aligned to the kerf centers 34 when the dicing is performed. The overlap regions of the scribe lines 26 in the X-direction and the scribe lines 26 in the Y-directions are referred to as crossroads 32.

Figure 6A:
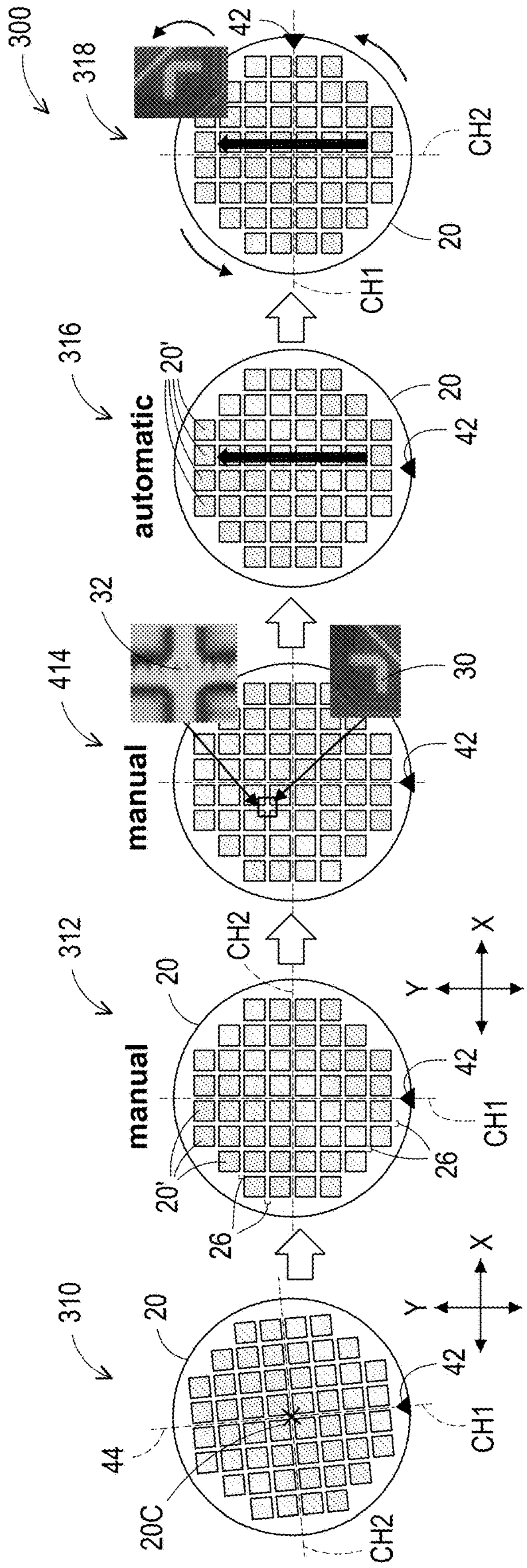
FIGS. 6A, 6B, 7A, 7B, 8A, 8B, 9A, and 9B illustrate the processes for measuring wafers and sawing the wafers in accordance with some embodiments.

It is appreciated that when a wafer is loaded on a wafer-holding platform (60 in FIG. 15), the wafer 20 may not have its desirable channel direction (CH1 or CH2) aligned to X-direction. FIG. 6A illustrates an example top view of wafer 20, wherein the lengthwise direction of the scribe lines (in process 310) is not parallel to the X-direction and Y-direction. Throughout the description, wafer 20 may include notch 42, and the straight line 44 connecting notch 42 to the wafer center 20C will be parallel to lengthwise directions of some scribe lines. The corresponding direction linking notch 42 and wafer center 20C is referred to as channel direction CH1, and the direction perpendicular to channel direction CH1 is referred to as channel direction CH2.

Wafer 20 will be rotated, so that either channel direction CH1 or channel direction CH2 is parallel to the X-direction. The corresponding operation is referred to as channel leveling. Throughout the description, the channel leveling includes channel CH1 leveling (to align channel CH1 to the Y-direction) and channel CH2 leveling (to align channel CH2 to the Y-direction). It is appreciated that the concepts of channels CH1 and CH2 are also relative, and my be inversed.

Referring back to FIG. 3, each of dies 20' may include one or more seal rings 28. Dicing marks 30, which are such named since they may be used for identification purpose in the dicing process are at the corner regions of the dies 20'. In accordance with some embodiments, dicing marks 30 have L-shapes, and hence are alternatively referred to as L-marks, while dicing marks 30 may have other shapes.

FIG. 3 also illustrate the die pitch P1 in the column direction (Y-direction) in accordance with some embodiments. The die pitch P1 may be measured directly based in the corresponding edges of neighboring dies 20' in the same column. Die pitch P1 may also be measured indirectly by measuring pitch P1' of corresponding dicing marks 30 in the neighboring dies 20' since die pitch P1 is equal to pitch P1'. Similarly, the die pitch P2 in the row direction is also illustrated. The die pitch P2 may be measured directly based in the corresponding edges of neighboring dies 20' in the same row, or measured indirectly by measuring the pitch P2' of the corresponding dicing marks 30 in the neighboring dies 20'. Die pitch P1 may be equal to or different from die pitch P2.

Figure 15:
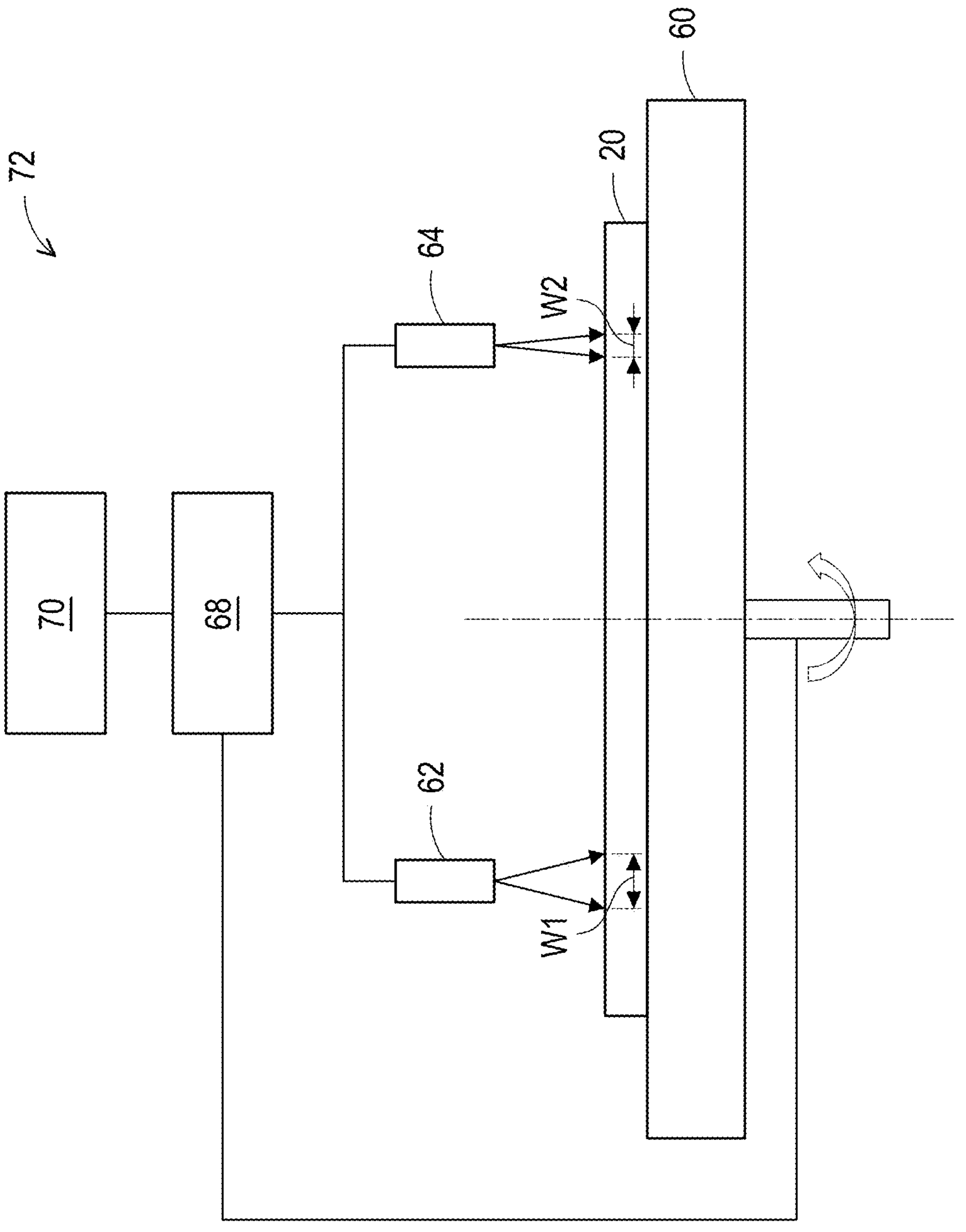
FIG. 15 illustrates a wafer dicing apparatus for automatically dicing wafers in accordance with some embodiments.

FIG. 15 illustrates an auto dicing tool 72 that is used for automatically measuring and dicing wafers in accordance with some embodiments. The auto dicing tool 72 is also used in the building of the dicing recipes. Auto dicing tool 72 includes wafer-holding platform 60 for securing the wafer 20 that is to be sawed. Wafer-holding platform 60 is also configured to rotate wafer 20, for example, during the leveling process, and when rotating wafer by 90 degrees to turn from channel CH1 to channel CH2 (or from channel CH2 to channel CH1). Auto dicing tool 72 further includes a low Charge-Coupled device (CCD) camera 62, a high CCD camera 64, a control unit 68, and a database 70. The control unit 68 is used for controlling and coordinating the wafer measuring and dicing, and includes the software for controlling and coordinating the wafer measuring and dicing processes.

Low CCD camera 62 and high CCD camera 64 are located over wafer 20, and are configured to capture images of wafer 20. Low CCD camera 62 has a wider field for capturing the images of a larger part of wafer, and high CCD camera 64 has a narrower field for capturing the images of a smaller part of wafer. For example, the width W2 of the field of high CCD camera 64 is smaller than the width W1 of the low CCD camera 62. The definition of high CCD camera 64, on the other hand, is higher than the definition of low CCD camera 62. The images captured by low CCD camera 62 and high CCD camera 64 may be used by the controlling unit 68, which, for example, has the function (and the software) comparing the patterns in the captured images with the patterns stored in the database 70 to find dicing marks and crossroads.

Figure 4:
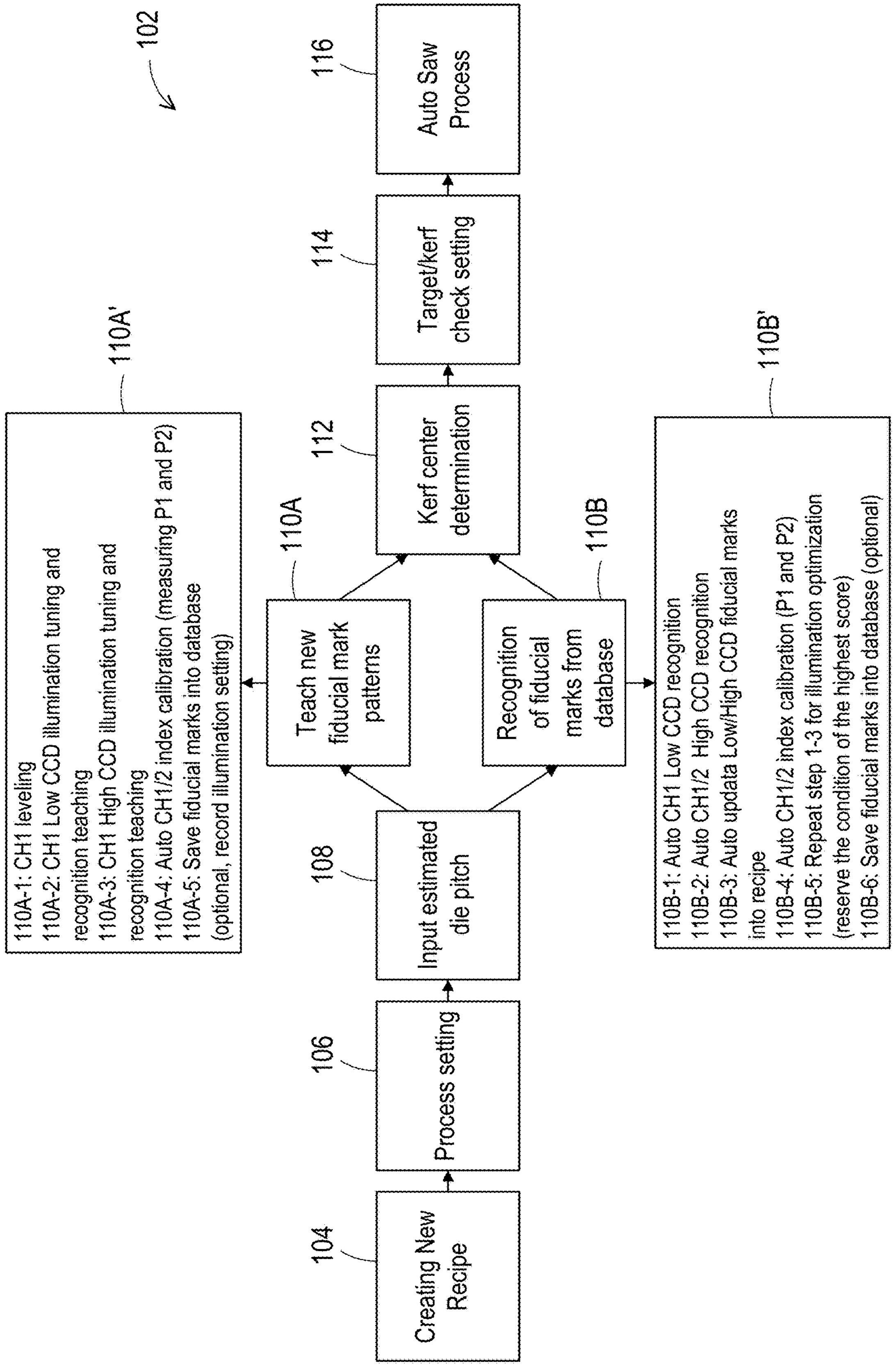
FIG. 4 illustrates a simplified pattern teaching, auto pattern recognition, and wafer dicing process in accordance with some embodiments.

FIG. 4 illustrates a process 102 for creating a new recipe that is used for dicing a new type of wafers (which have identical structure), building the recipe, performing measurement to determine kerf centers, and performing the dicing process. Some details of the processes shown in FIG. 4 are also discussed in detail referring to FIGS. 5, 6A, 6B, 7A, 7B, 8A, 8B, 9A, and 9B. The discussion of FIG. 4 provides an overall view of the wafer-sawing process of new tape-out wafers.

Referring to process 104 in FIG. 4, a new recipe is created for the new tape-out, in which a new type of wafer having a new structure is provided. The new recipe may be generated from a pre-formed template, which may be in the form of a file, and/or the entries in database 70 (FIG. 15). The recipe may include a plurality of parameters that are used for sawing the wafer, which parameters include, and are not limited to, die pitches P1 and P2, wafer thickness, rotation speed of the blade, moving speed of the blade, and/or the like. In the subsequent building process of the recipe, the patterns of dicing marks 30, the pattern of crossroads 32, and the like, are also added as parts of the recipe, In process 106 (process setting), some initial parameters such as the wafer thickness, the rotation speed of the blade, the moving speed of the blade, and/or the like, are provided to the auto dicing tool 72 (FIG. 15).

In process 108, estimated die pitches P1 and P2 may be provided to the auto dicing tool 72 (FIG. 15). Die pitches P1 and P2 may be estimated values that are used to speed up the operation, and will be updated to more accurate values obtained through the subsequent measurement processes. For example, providing estimated values of pitches P1 and P2 may help the automatic dicing tool 72 to quickly move to the likely positions of the crossroads and dicing marks, and to speed up the measurements.

Process 110A is then performed. This process is performed when the database for the new tape-out wafer has not been fully built yet. This process also corresponds to the process 300 shown in FIGS. 6A and 6B. Process 110A is performed with some manual actions, and its results are provided to database 70, so that the dicing of subsequent wafers may be made automatic. Process 110A includes manually identifying dicing marks 30, and the identified pattern(s) are provided to (also referred to as "teaching" new fiducial mark patterns) the automatic dicing tool 72. The patterns of dicing mark 30 is saved in database 70, and may be used in subsequent auto operations.

Some example operations in process 110A are shown in frame 110A' in FIG. 4. In accordance with some embodiments, process 110A includes a manual channel CH1 leveling process (step 110A-1). A low CCD camera 62 (FIG. 15), which has a lower accuracy but a greater field (than high CCD camera 64) is used, and its illumination value is tuned (step 110A-2) to provide optimum recognition of the patterns such as dicing marks 30 and crossroads 32. Using the low CCD camera, the operator of the dicing tool 72 may manually point to the dicing marks 30 and crossroads 32, so that dicing tool 72 learns their patterns.

A high CCD camera 64 (FIG. 15), which has a higher accuracy but smaller field (than the low CCD camera 62) is used, and its illumination value is tuned (step 110A-3) to provide optimum recognition of the patterns such as dicing marks 30 and crossroads 32. Using the high CCD camera 64, the operator of the dicing tool 72 may also manually point to the dicing marks 30 and crossroads 32, so that auto dicing tool 72 learns their patterns.

An automatic CH1 and CH2 index calibration process is then performed (step 110A-4), in which the pitches P1 and P2 are measured, for example, using the identified dicing marks 30. For example, pitch P1 is measured by measuring pitch P1' (which is equal to pitch P1), and pitch P2 is measured by measuring pitch P2' (which is equal to pitch P2).

The pattern of dicing mark 30 and crossroads 32 may be saved in database 70 (step 110A-5). Also, the optimum illumination values of the low CCD camera 62 and the high CCD camera 64 may be saved in the database 70, so that in subsequent operations, the low CCD camera 62 and the high CCD camera 62 may be tuned to their optimum illumination values.

Process 110B is performed when the dicing recipe has already been built in database 70 (FIG. 15) for the new tape-out wafer. This process also corresponds to the processes shown in FIGS. 7A and 7B, the processes shown in FIGS. 8A and 8B, and the processes shown in FIGS. 9A and 9B. Accordingly, process 110B is performed with auto actions, and its results are updated to database 70 (FIG. 15), so that the dicing of subsequent wafers may be made more automatic and more accurate. Process 110B is performed to automatically identify dicing marks 30. Also, when process 110B is performed with better results, its results are updated to database 70.

Some example operations in process 110B are shown in frame 110B' in FIG. 4. In accordance with some embodiments, process 110B includes an auto channel CH1 leveling process (step 110B-1), in which low CCD camera 62 may be used to recognize patterns (such as the patterns of dicing marks 30 and crossroads 32). If the recognized patterns using the low CCD camera are better (for example, the patterns are recognized with better clarity (higher score)) than what are saved in database 70 (and as parts of the recipe), the patterns of the recognized patterns are updated into database 70 (step 110B-3). Otherwise, no update is performed.

Similarly, a high CCD camera 64 may be used to recognize patterns (such as dicing marks 30 and crossroads 32). If the recognized patterns using the high CCD camera 64 have higher scores than what are saved in database 70, the patterns of the recognized patterns are updated into database 70 (also step 110B-3). Otherwise, no update is performed.

An automatic CH1 and CH2 index calibration is also performed (step 110B-4), in which the pitches P1 and P2 are measured automatically, for example, using the save patterns to identify dicing marks 30, and measuring the pitches P1' and P2' of the dicing marks 30. The pattern of dicing mark 30 recognized using this process may be updated in database 70.

Referring to step 110B-5, different illumination values may be used for low CCD camera 62 and high CCD camera 64, and the steps (110B-1, 110B-2 and 11B-3) may be repeated for each of the illumination values, and for each of the low CCD camera 62 and high CCD camera 64. The illumination values corresponding to the highest scores of recognized patterns may be save in the database 70, and used in future wafer dicing. Also, the patterns of the dicing marks 30 with highest scores (correspond to the optimum illumination values) may be updated into database (step 110B-6).

In subsequent processes, as shown in process 112, kerf centers 34 (FIG. 3) are determined. The determination of the kerf centers is discussed referring to FIGS. 12A and 12B, as will be discussed in subsequent paragraphs.

Process 114 includes further kerf checking, and upon the confirmation, the wafer is sawed automatically, as represented by process 116.

Figure 5:
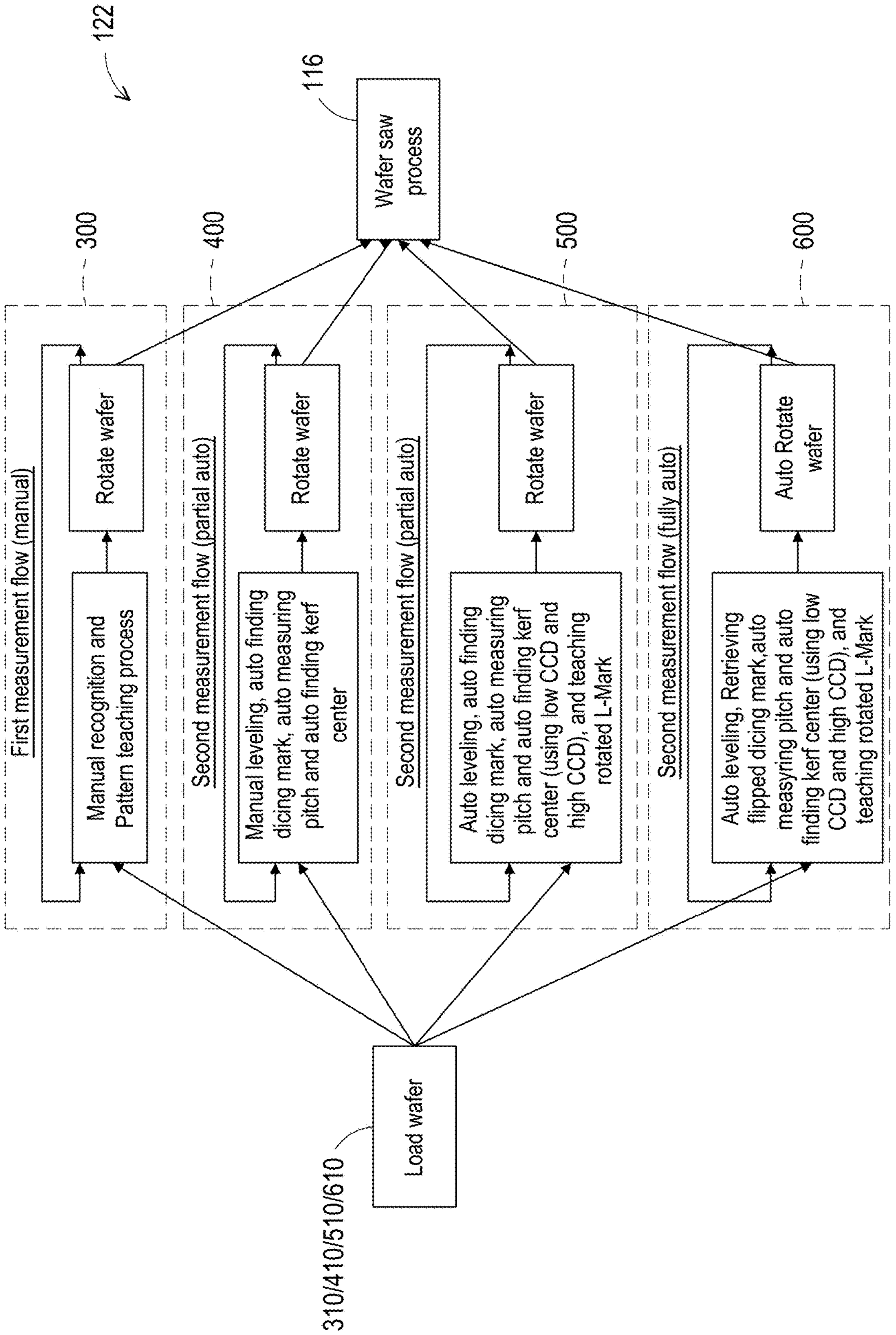
FIG. 5 illustrates a recipe generation process for generating a recipe and using the recipe for dicing wafers in accordance with some embodiments.

FIG. 5 illustrates the processes for performing measurements on wafers to determine wafer kerf centers, and then sawing wafers. There are four possible process flows 300, 400, 500, and 600. Each of the process flows 400, 500, and 600 has a higher degree of automation than the preceding process flows 300, 400, and 500, respectively. Process 300 is a manual process, which is performed when the database 70 has not been fully built yet, and also corresponds to process 110A (and 110A') in FIG. 4, and to the processes shown in FIGS. 6A and 6B.

Process flows 400, 500, and 600 are automatic processes, which are performed when the database has been fully built, and these process flows also correspond to process 110B (and 110B') in FIG. 4. Process flow 400 correspond to FIGS. 7A and 7B. Process flow 500 correspond to FIGS. 8A and 8B. Process flow 600 correspond to FIGS. 9A and 9B. Therefore, FIG. 5 illustrates some brief operations, and the details are shown in (and are discussed referring to) FIGS. 6A, 6B, 7A, 7B, 8A, 8B, 9A, and 9B.

the operations shown in subsequently discussed processes 300, 400, 500, and 600 are performed using auto dicing tool 72 in FIG. 15. The automatic measurement and the automatic dicing of auto dicing tool 72 are controlled by control unit 68 (FIG. 15), which controls and coordinates all of the operations of all components of auto dicing tool 72, which include, and are not limited to, the rotation of wafer-holding platform 60, the operations of low CCD camera 62 and high CCD camera 64, the recognition (using the software in control unit 68) of the patterns from the images captured by cameras, the comparisons of the patterns, and the saving and the subsequent updating of the patterns and the illumination values of the cameras.

Figure 6B:
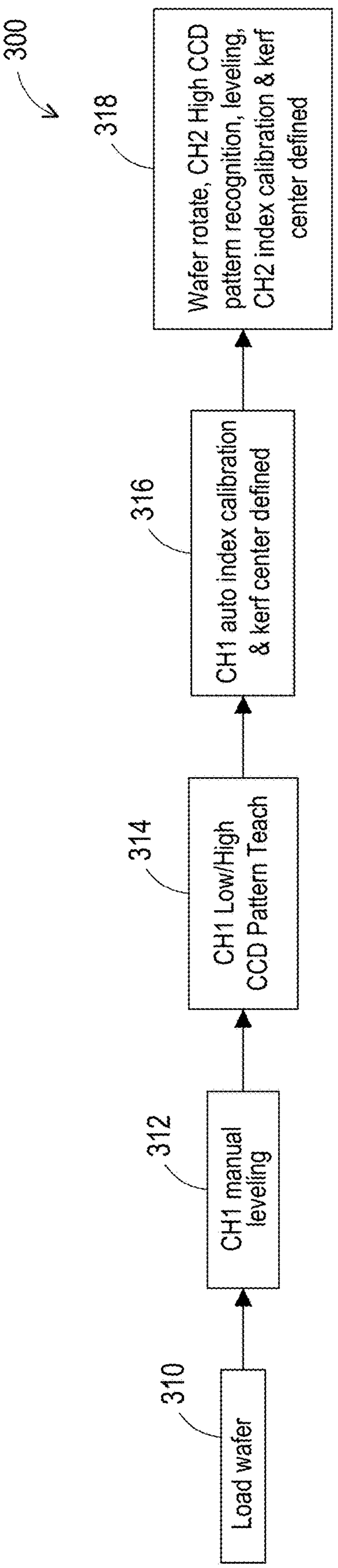

FIGS. 6A and 6B illustrate the schematic top views and the process flow, respectively, of a manual wafer measurement process and the pattern teaching process (so that the patterns are saved in database, and the auto dicing tool may recognize the patterns) in accordance with some embodiments. The processes in the top views shown in FIG. 6A correspond to the processes shown in FIG. 6B with a one-to-one correspondence.

Referring to process 310 (FIG. 6B), wafer 20 is loaded to auto dicing tool 72 (FIG. 15), and is fixed on wafer-holding platform 60. As shown in process 310 in FIG. 6A, wafer 20 is tilted, with its channel directions misaligned from X-direction and Y-direction.

Next, in process 312, a leveling process is performed to level wafer 20, so that the channel CH2 is aligned to the X-direction, and channel CH1 is aligned to the Y-directions. In accordance with some embodiments, the leveling is performed manually by the human operator of the auto dicing tool 72. The operator identifies the corresponding features that are aligned to channel CH1. For example, as shown in FIG. 3, the corresponding features may be crossroads 32 or dicing marks 30, which are shown in amplified views of process 314 in FIG. 6A. When two crossroads 32 in a same column are parallel to the Y-direction (by rotating wafer 20), the channel CH1 leveling is achieved, and the top view of the resulting wafer is shown in process 312 in FIG. 6A. Similarly, when two dicing marks 30 (rather than crossroads) in the corresponding positions of the dies 20' in a same column are parallel to the Y-direction (by rotating wafer 20), the channel CH1 leveling is achieved.

Process 314 is a manual process, in which either one or both of low CCD camera 62 and high CCD camera 64 are used, and the operator finds the dicing mark(s) 30 from wafer 20. The operator then instructs (thus teaches) the auto dicing tool 72 that the identified dicing mark(s) 30 are the marks that the auto dicing tool 72 will use for subsequent auto index calibration (such as pitch measurement) and auto kerf center finding. At this time, the pattern of the manually identified dicing marks 30 may be saved into database 70 (also refer to step 110A-2 in FIG. 4). Also, the pattern of the crossroads 32 may also be saved into database 70.

Process 316 is the process of automatically measuring the die pitches P1 and P2 (FIG. 3) of dies 20'. For example, FIG. 3 illustrates how the die pitch P1 may be measured indirectly by measuring the pitch P1' (equal to die pitch P1) of the identified dicing marks 30. The auto dicing tool 72 may measure the die pitches between each pair of neighboring rows of dies 20', and calculate an average die pitch, which is the die pitch P1 to be used subsequently.

Also, with the pattern of dicing marks 30 being known through the process 314, kerf centers may also be determined. For example, FIG. 12B illustrates how the kerf center 34 may be determined based on dicing marks 30. When a dicing mark 30 is found (the illustrated original pattern in FIG. 12B), its mirrored pattern may be determined, and auto dicing tool 72 will search the mirrored pattern that is nearest the original pattern. The kerf center 34 is thus determined as the center line in the middle of the original pattern and the mirrored pattern. In this process, all of the kerf centers of all scribe lines that are perpendicular to the channel CH1 direction are determined.

Process 318 illustrates the rotation of wafer 20 by 90 degrees (refer to the change in the position of notch 42), so that channel CH1 direction is now parallel to the X-direction, and channel CH2 direction is parallel to the Y-direction. The processes 312, 314, and 316 will then be repeated for the channel CH2 direction, so that the additional die pitches P2/P2' and the kerf centers perpendicular to the channel CH2 direction are determined.

After the kerf centers for both of channels CH1 and CH2 are determined, wafer 20 may be automatically sawed by auto dicing tool 72, wherein wafer 20 is sawed (process 116 in FIG. 5) along the determined kerf centers.

Figure 7A:
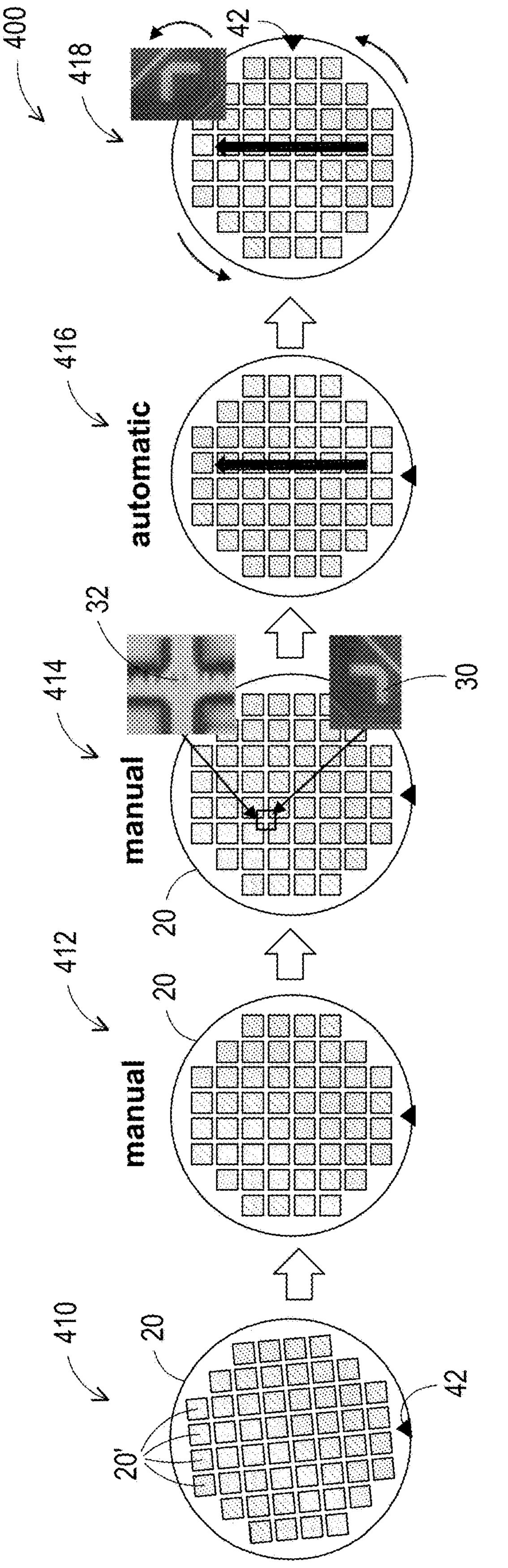
Figure 7B:
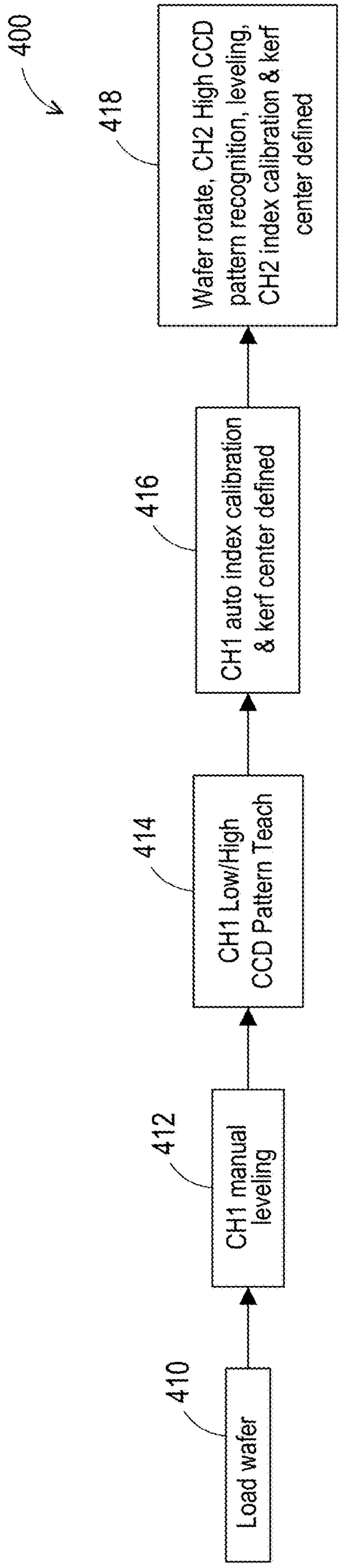

FIGS. 7A and 7B illustrate the schematic top views and the process flows of a partially manual and partially auto wafer measurement process in accordance with some embodiments. The top views shown in FIG. 7A correspond to the processes shown in FIG. 7B. It is appreciated that these processes are performed based on the recipe built in the processes shown in FIGS. 6A and 6B, so that the database 70 has already had the information such as the patterns of dicing marks 30 and crossroads 32, the illumination values for low CCD camera 62 and high CCD camera 64, etc.

In process 410, wafer 20 is loaded onto wafer-holding platform 60 (FIG. 15). Next, a manual wafer leveling process is performed, and the resulting top view and the process correspond to the process 412 as shown in FIGS. 7A and 7B. The details of this process may be essentially the same as process 312 (FIGS. 6A and 6B), and are not repeated herein.

Referring to process 414, crossroads 32 are found using low CCD camera, and dicing marks 30 are found near the crossroads 32. This process is an automatic process, and the finding of dicing marks 30 is by matching the patterns near the crossroads 32 to the dicing mark pattern saved in database 70, which dicing mark pattern is learned by the auto dicing tool 72 in the process 314 (FIGS. 6A and 6B).

Next, in process 416, die pitches are measured, and kerf centers are determined. The details of this process may be essentially the same as process 316 (FIGS. 6A and 6B), and are not repeated. The measurement for channel CH1 is thus completed.

Next, in process 418, wafer 20 is rotated by 90 degrees, and the processes preformed in processes 412, 414, and 416 are repeated for channel CH2. Wafer 20 may then be diced along the found kerf centers.

Figure 8A:
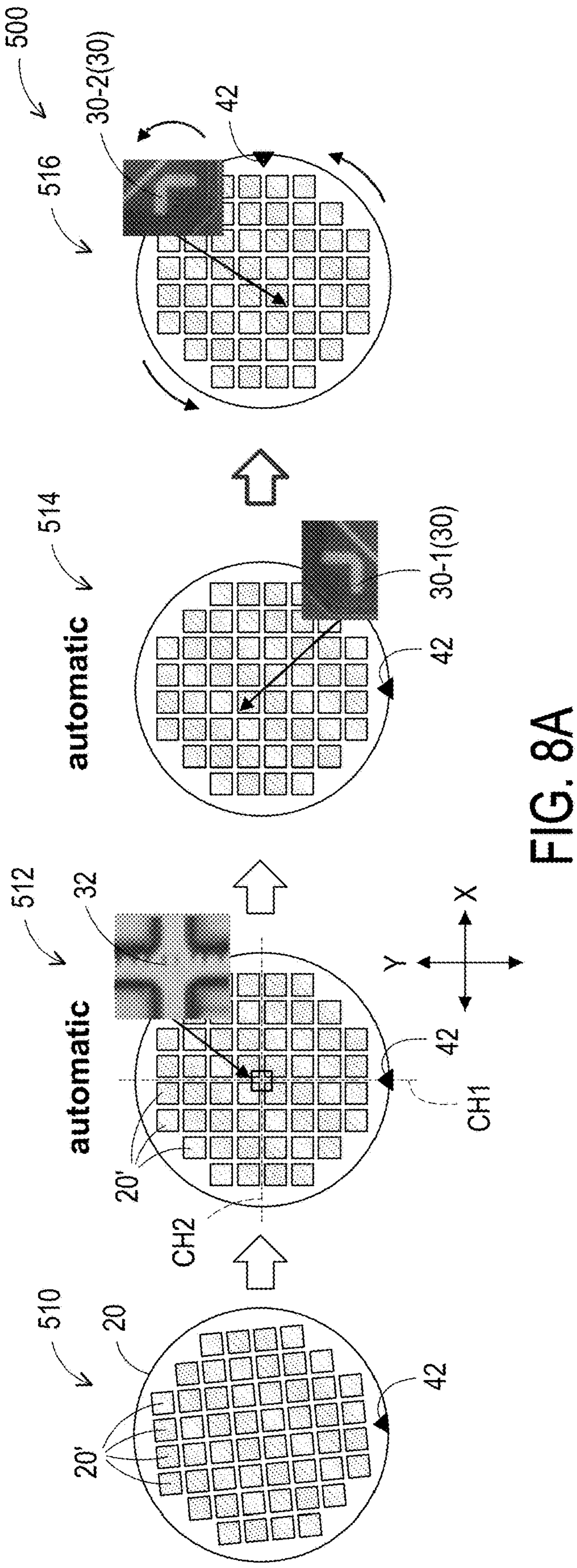
Figure 8B:
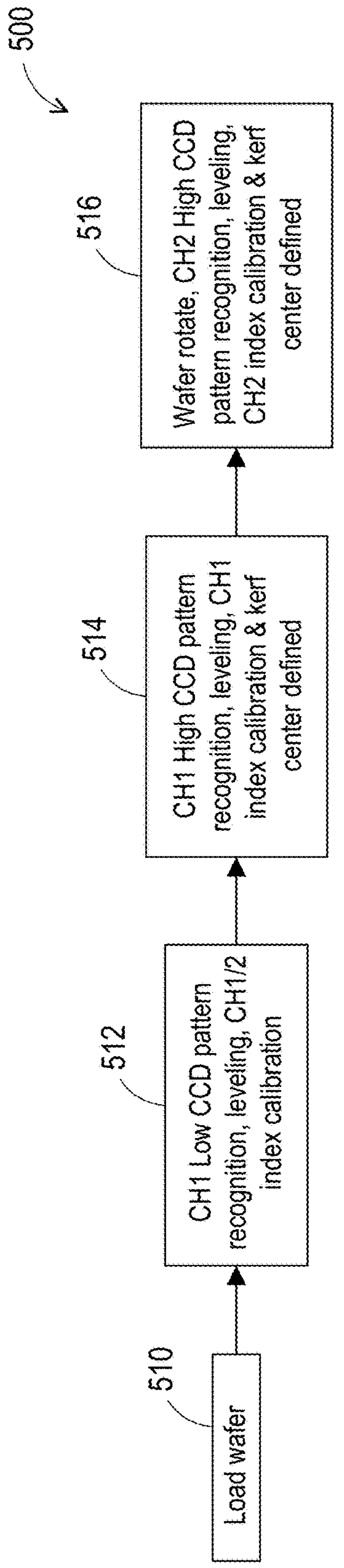

FIGS. 8A and 8B illustrate the schematic top views and the process flows of a fully automatic wafer measurement process in accordance with some embodiments. The top views shown in FIG. 8A correspond to the processes shown in FIG. 8B.

In process 510, wafer 20 is loaded onto wafer-holding platform 60 (FIG. 15). Next, in process 512, an automatic wafer leveling process is performed, and the resulting top view and the process are shown in FIGS. 8A and 8B. The leveling, instead of being performed manually, is performed automatically by auto dicing tool 72, wherein the low CCD camera 62 is used to capture an image, and a software in auto dicing tool 72 is used to find from the captured image the crossroads 32 (or dicing marks 30, whose patterns are already in the database). Auto dicing tool 72 then levels channel CH1 by rotating wafer 20.

Referring to process 514, the high CCD camera 64 is used to perform a more accurate channel CH1 leveling process.

Dicing marks 30 are recognized near the crossroads 32. This process is also an automatic process, and the finding of dicing marks 30 is by matching the patterns near the crossroads 32 to the pattern of dicing marks 30 saved in database 70, which patterns are saved in the process 314 (FIGS. 6A and 6B). Next, die pitches are measured (also referred to as index calibration), and kerf centers are determined. The details for measuring the die pitches and determining kerf centers have been discussed in details referring to process 316, and are not repeated herein.

Next, in process 516, wafer 20 is rotated by 90 degrees. An addition operation that may be performed in this process is to manually teach the pattern of the rotated dicing mark 30. For example, the dicing mark 30 (the L-mark denoted as 30-1) before the rotation is shown in the top view of process 514 (FIG. 8A), while the dicing mark 30 (the L-mark denoted as 30-2) after the rotation is shown in the top view of process 516 (FIG. 8A). The operator may manually teach (and save in database) the pattern of dicing mark 30-2. The processes in processes 512 and 514 may then be repeated for channel CH2, in which the pattern of dicing mark 30-2, which was just taught, is used, for example, in the measurement of die pitches and the determination of the kerf centers for channel CH2.

Wafer 20 may then be diced along kerf centers (process 116 in FIG. 5).

Figure 9A:
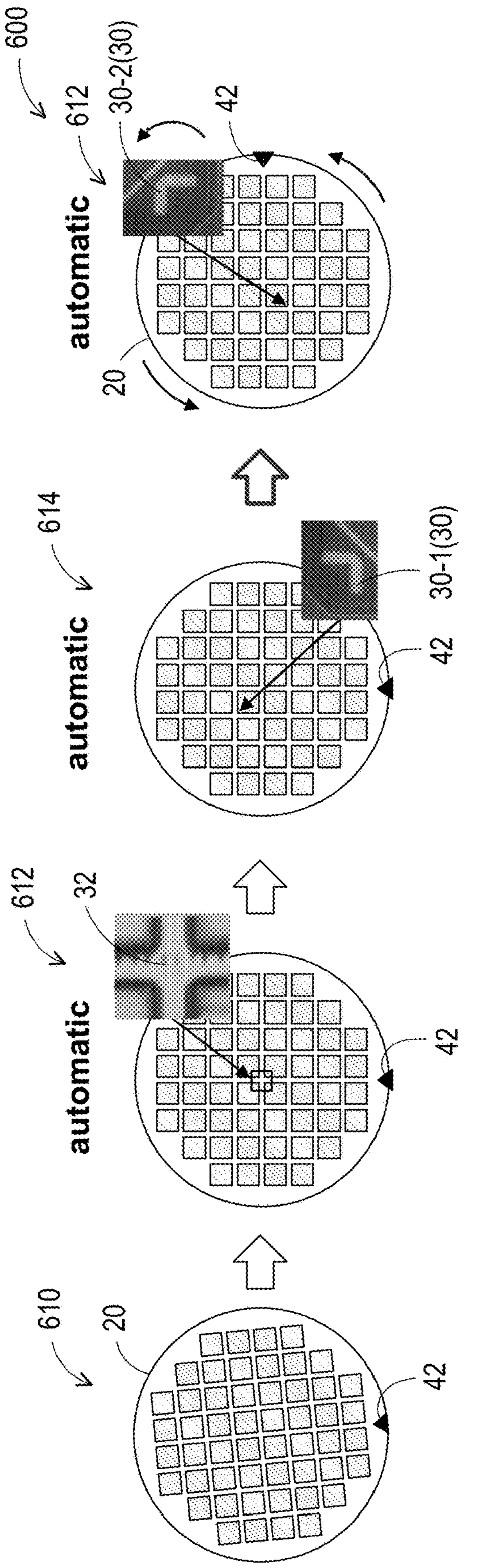
Figure 9B:
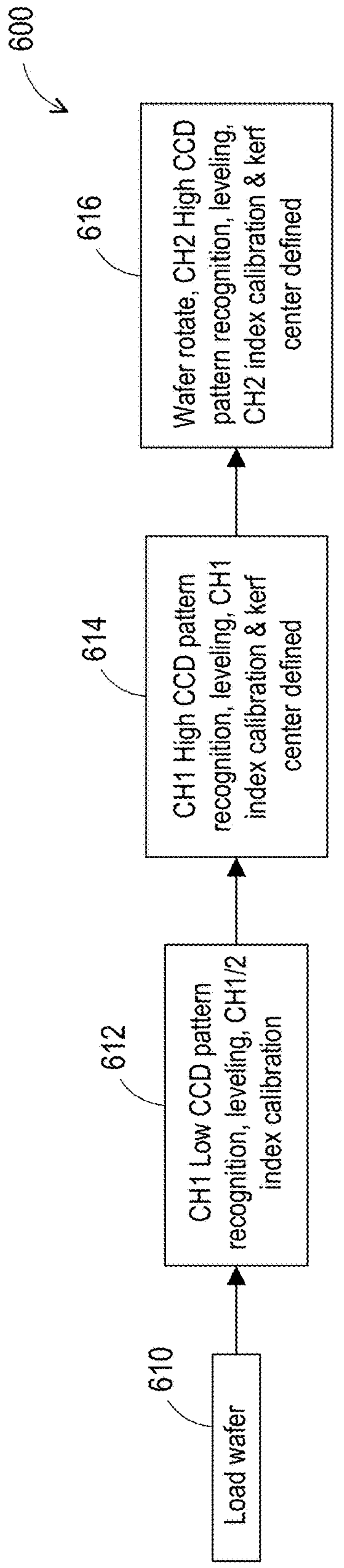

FIGS. 9A and 9B illustrate the schematic top views and the process flows of a fully automatic wafer measurement process in accordance with some embodiments. The top views shown in FIG. 9A correspond to the processes shown in FIG. 9B. The processes 610, 612, and 614 are essentially the same as processes 510, 512, and 514, respectively, and the details are not repeated herein.

Process 616 is similar to process 516, except that instead of manually teach the auto dicing tool 72 what the pattern of the rotated dicing mark 30 will be, the pattern of dicing mark 30-1 (before rotation, refer to process 614) is retrieved from database 70, and is rotated to generate dicing mark 30-2. This process is automatically performed by auto dicing tool 72, and is considered as a self-teaching process. After the pattern of dicing mark 30-2 is generated (and may also be saved in the database for future wafers), the processes 612 and 614 are repeated for channel CH2, in which the pattern of dicing mark 30-2, which was just generated by auto dicing tool 72, is used, for example, in the measurement of die pitches and the determination of kerf centers.

As shown in FIGS. 6A, 6B, 7A, 7B, 8A, 8B, 9A, and 9B, the dicing of a wafer has no redundant (repeated) processes. Since all the operations are performed in a same auto dicing tool 72 and on the same wafer-holding platform 60 (FIG. 15), there is no redundant operations. For example, the dicing of a wafer has one channel CH1 leveling process and one channel CH2 leveling process. As a comparison, in other processes for dicing wafers, the wafers to be sawed may be put on different platforms for different operations such as measuring die pitches and determining kerf centers. On each of the platforms, channel CH1 leveling process and channel CH2 leveling process were performed, hence are redundant processes that cause the reduction of the throughput of the wafer dicing process. In addition, the leveling processes were manual processes that were slow.

Figure 10A:
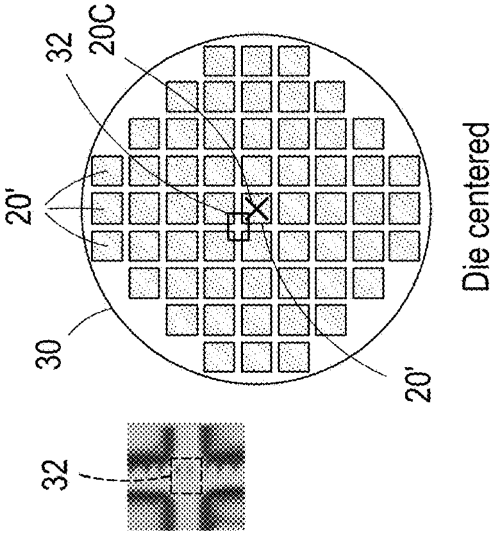
FIGS. 10A, 10B, 10C, and 10D illustrate methods of speeding up crossroad recognition in accordance with some embodiments.
Figure 10B:
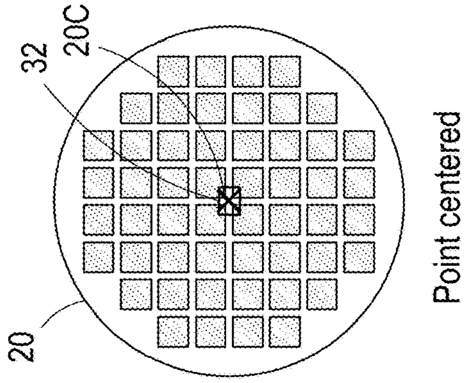
Figure 10C:
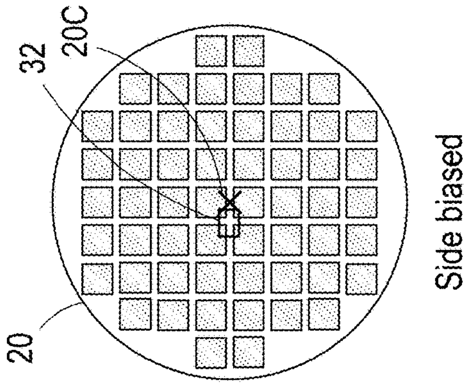
Figure 10D:
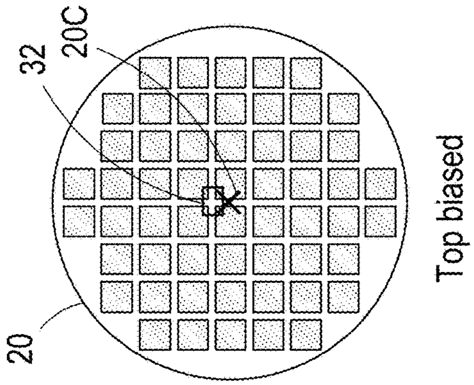

FIGS. 10A, 10B, 10C, and 10D illustrate a method of speeding up the finding of crossroads 32. In the crossroad-finding process, the wafer center 20C is first found, and crossroad 32 is found in the nearby regions of wafer center 20C. In a leveled wafer 20, there are four possible positions that a crossroad 32 may be located. FIG. 10A illustrates a die centered wafer 20, in which the wafer center 20C is also a center of a die 20'. In this case, crossroad 32 is at a corner of die 20'. A magnified view of the crossroad 32 is also illustrated. FIG. 10B illustrates a point centered wafer 20, in which the wafer center 20C is also a center of a crossroad 32. FIG. 10C illustrates a side biased wafer 20, in which the crossroad 32 is aside wafer center 20C. FIG. 10D illustrates a top biased wafer 20, in which crossroad 32 is atop wafer center 20C. Accordingly, the auto dicing tool 72 may simple check these four locations relative to wafer center 20C to quickly find a crossroad 32, rather than search the entire nearby region.

Figure 11:
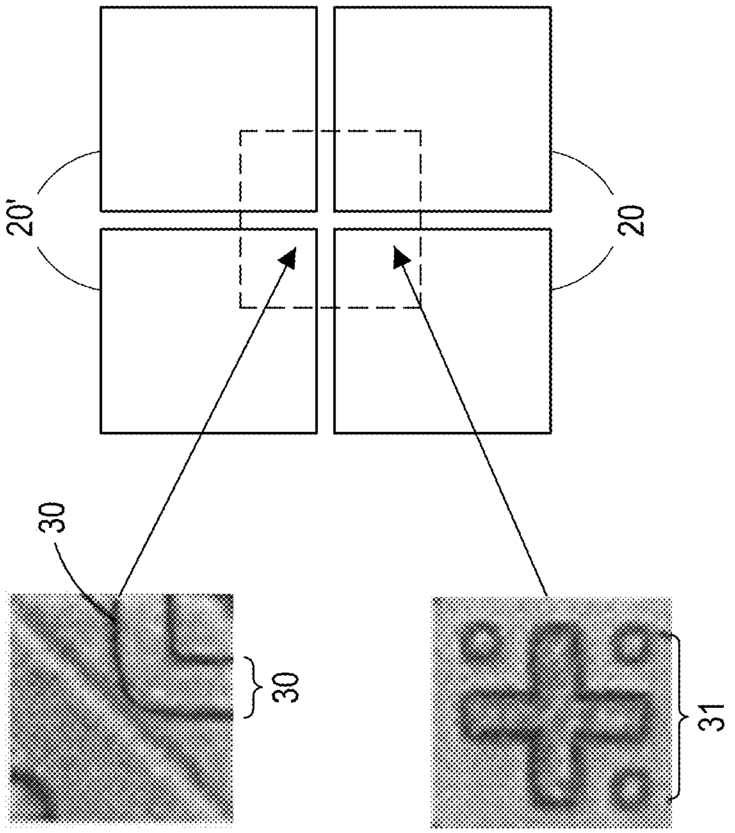
FIG. 11 illustrates an L-mark and another directional mark in accordance with some embodiments.

In above-discussed examples, it is assumed that dicing mark 30 is an L-mark that is at the corner of the die and close to crossroad 32. Since an L-mark (the example dicing mark 30) is symmetric in the sense that if wafer is flip-placed on wafer-holding platform 60, with the bottom side facing up, the auto dicing tool 72 is unable to tell whether the wafer is flipped or not. In accordance with some embodiments, as shown in FIG. 11, an additional directional mark 31 may be used in combination with the L-mark as the dicing mark, so that if the wafer is flipped, it can be detected.

Figure 12A:
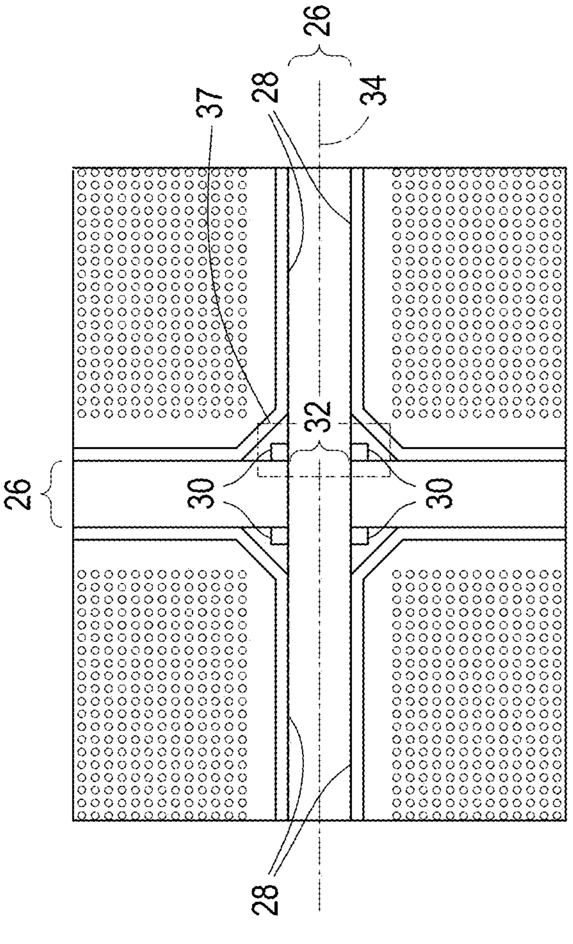
FIG. 12A illustrates a crossroad of a wafer in accordance with some embodiments.
Figure 12B:
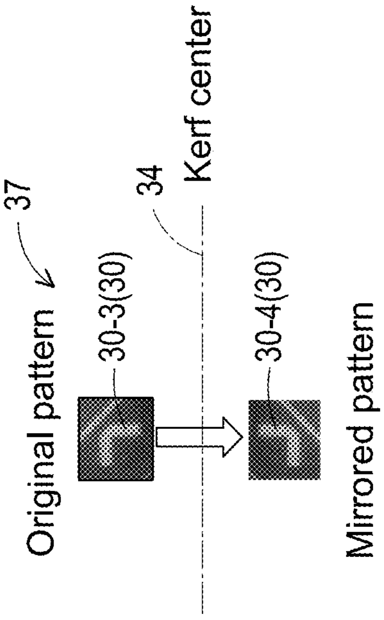
FIG. 12B illustrates using a dicing mark and a mirrored dicing mark to determine a kerf center in accordance with some embodiments.

FIGS. 12A and 12B illustrate how the dicing marks 30 can be used to determine kerf centers. FIG. 12A illustrates a magnified view of a crossroad 32, with an L-shaped dicing mark at each corner. FIG. 12B illustrates region 37 in FIG. 12A. When the auto dicing tool 72 finds a dicing mark 30 (marked as 30-3 in FIG. 12B), it can simply flip the pattern of dicing mark 30 to generate the pattern of another dicing mark 30 (marked as 30-4). The auto dicing tool 72 may then search the regions nearby dicing mark 30-3 to find dicing mark 3-4. The kerf center 34 is determined as being the middle line between dicing mark 30-3 and dicing mark 3-4.

Figures 13, 14A, 14B, 14C:
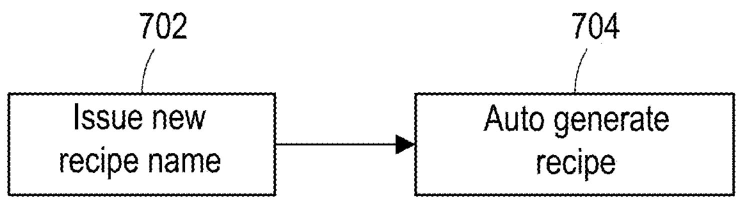
FIG. 13 illustrates a process for auto generating a wafer dicing recipe in accordance with some embodiments.
FIG. 14A illustrates a format of a file name of a wafer dicing recipe in accordance with some embodiments.
FIGS. 14B and 14C illustrate two example file names of wafer dicing recipes in accordance with some embodiments.

FIG. 13 illustrates the generation of a new recipe for dicing a new tape-out wafer. First, the new recipe name is generated (process 702). The recipe name is discussed referring to FIGS. 14A, 14B, and 14C. A recipe is automatically generated, for example, by copying a recipe template. The recipe may be generated from an existing recipe such as the recipe of a device die, the recipe of an Integrated Fanout (INFO) package, or the like, which has the structure close to the structure of the wafers to be diced. The initial recipe may include various parameters that will be used for dicing the wafer, which include, and are not limited to, estimated die pitches P1 and P2, wafer thickness, rotation speed of the blade, moving speed of the blade, and the like. The pattern of the dicing mark, the pattern of the rotated dicing mark, the illumination values will be updated into the recipe once these parameters are obtained from the wafers that are sawed, as discussed referring the embodiments of the present application.

FIG. 14A illustrates a format of the recipe name, which format is designed to speed up the automatic dicing process. The recipe name may indicate that the recipe is for a new tape-out (NTO), and includes the template name of the type of the wafer, the part name (the product name), the estimated CH1 pitch, estimated the CH2 pitch, the wafer thickness, and the like. The auto dicing tool 72, when picking up the recipe, may be able to set up some process parameters from the name of the recipe. FIGS. 14B and 14C illustrate two example, recipe names.

The embodiments of the present disclosure have some advantageous features. The measurement and the sawing of wafers may be performed on a same platform and in a same auto dicing tool. Accordingly, there is no redundant work. As a comparison, if the measurement and the sawing of wafers are performed on different platforms, some of the operations are repeated and thus are wasted. For example, in conventional wafer dicing process, the measurement of the die pitches is manually performed on a first platform, while the determination of the kerf centers and the dicing are performed on second platform. On each of the first platform and the second platform, leveling needs to be done. In accordance with the embodiments of the present disclosure, since one platform is used, no operation is wasted.

In addition, through automatic operations that may be performed based on the built database, the throughput is improved. The update of the database with the patterns and the illumination with higher scores further improve the accuracy of the operation.

In accordance with some embodiments of the present disclosure, a method includes forming a database; finding a plurality of dicing marks on a first wafer, wherein patterns of the plurality of dicing marks match a first pattern in the database; measuring a first-channel die pitch of the first wafer according to a first pitch of adjacent two of the plurality of dicing marks; determining kerf centers of the first wafer based on the plurality of dicing marks, wherein the measuring the first-channel die pitch and the determining the kerf centers are performed on a same wafer-holding platform; and dicing the first wafer into a plurality of dies, wherein the dicing is performed aligning to the kerf centers.

In an embodiment, the method further comprises leveling the first wafer manually, wherein the leveling is performed by recognizing crossroads of the first wafer as recognizing patterns. In an embodiment, the method further comprises leveling the first wafer automatically through an auto dicing tool, wherein the leveling is performed by recognizing crossroads of the first wafer. In an embodiment, the leveling the first wafer is performed using a low CCD camera. In an embodiment, the method further comprises performing an additional leveling process on the first wafer using a high CCD camera to achieve improved accuracy.

In an embodiment, the method further comprises performing a manual dicing mark finding process to find one of the plurality of dicing marks from the first wafer, wherein the one of the plurality of dicing marks has the first pattern; and saving the first pattern into the database. In an embodiment, the method further comprises automatically finding an additional plurality of dicing marks from a second wafer using an auto dicing tool, wherein the automatically finding the additional plurality of dicing marks from the second wafer comprises comparing the patterns of the second wafer with the first pattern that has been saved in the database.

In an embodiment, the method further comprises saving illumination values in the manual dicing mark finding process into the database. In an embodiment, the measuring the first-channel die pitch of the first wafer is an automatic process that is performed using a low CCD camera. In an embodiment, the method further comprises measuring the first-channel die pitch of the first wafer using a high CCD camera. In an embodiment, the high CCD camera has a higher definition than the low CCD camera. In an embodiment, the method further comprises rotating the first wafer by 90 degrees; rotating the first pattern in the database by 90 degrees to generate a second pattern; finding a second plurality of dicing marks in the first wafer that matches the second pattern; and using the second plurality of dicing marks to measure a second-channel die pitch. In an embodiment, the method further comprises saving the second pattern into the database.

In accordance with some embodiments of the present disclosure, a method includes dicing a first wafer comprising manually identifying a first dicing mark from the first wafer; saving a first pattern of the first dicing mark into a database; automatically measuring a first die pitch of the first wafer; and automatically determining first kerf centers of the first wafer; and after the first wafer is diced, dicing a second wafer identical to the first wafer, wherein the dicing the second wafer comprises automatically identifying a second dicing mark from the second wafer by comparing patterns of the second wafer with the first pattern that has been saved in the database; automatically measuring a second die pitch of the second wafer; and automatically determining second kerf centers of the second wafer.

In an embodiment, the dicing the first wafer further comprises manually performing a first leveling process on the first wafer, wherein a second pattern of crossroads of the first wafer is identified; and the dicing the second wafer further comprises automatically performing a second leveling process on the second wafer by comparing patterns of the second wafer with the second pattern. In an embodiment, an entirety of the dicing the first wafer is performed on a wafer-holding platform of an auto dicing tool. In an embodiment, an entirety of the dicing the second wafer is performed on the wafer-holding platform of the auto dicing tool.

In accordance with some embodiments of the present disclosure, a method includes dicing a first wafer comprising manually performing leveling processes and dicing mark teaching processes; and saving patterns of the first wafer into a database; and dicing a second wafer identical to the first wafer, wherein the dicing the second wafer comprises automatically performing leveling processes; and automatically finding dicing marks on the second wafer using patterns of the first wafer saved in the database. In an embodiment, the patterns of the first wafer saved in the database comprises a pattern of an L-mark. In an embodiment, the patterns of the first wafer saved in the database comprises a pattern of a crossroad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a database;

finding a plurality of dicing marks on a first wafer, wherein patterns of the plurality of dicing marks match a first pattern in the database;

measuring a first-channel die pitch of the first wafer according to a first pitch between adjacent two of the plurality of dicing marks;

determining kerf centers of the first wafer based on the plurality of dicing marks, wherein the measuring the first-channel die pitch and the determining the kerf centers are performed on a same wafer-holding platform; and dicing the first wafer into a plurality of dies, wherein the dicing is performed by aligning to the kerf centers.

2. The method of claim 1 further comprising leveling the first wafer manually, wherein the leveling is performed by recognizing crossroads of the first wafer as recognizing patterns.

3. The method of claim 1 further comprising leveling the first wafer automatically through an auto dicing tool, wherein the leveling is performed by recognizing crossroads of the first wafer.

4. The method of claim 3, wherein the leveling the first wafer is performed using a low CCD camera.

5. The method of claim 4 further comprising performing an additional leveling process on the first wafer using a high CCD camera to achieve improved accuracy.

6. The method of claim 1 further comprising:

performing a manual dicing mark finding process to find one of the plurality of dicing marks from the first wafer, wherein the one of the plurality of dicing marks has the first pattern; and saving the first pattern into the database.

7. The method of claim 6 further comprising:

automatically finding an additional plurality of dicing marks from a second wafer using an auto dicing tool, wherein the automatically finding the additional plurality of dicing marks from the second wafer comprises comparing the patterns of the second wafer with the first pattern that has been saved in the database.

8. The method of claim 6 further comprising:

saving illumination values in the manual dicing mark finding process into the database.

9. The method of claim 1, wherein the measuring the first-channel die pitch of the first wafer is an automatic process that is performed using a low CCD camera.

10. The method of claim 9 further comprising measuring the first-channel die pitch of the first wafer using a high CCD camera.

11. The method of claim 10, wherein the high CCD camera has a higher definition than the low CCD camera.

12. The method of claim 1 further comprising:

rotating the first wafer by 90 degrees;

rotating the first pattern in the database by 90 degrees to generate a second pattern;

finding an additional plurality of dicing marks in the first wafer that matches the second pattern; and using the additional plurality of dicing marks to measure a second-channel die pitch.

13. The method of claim 12 further comprising saving the second pattern into the database.

14. A method comprising:

dicing a first wafer comprising:

manually identifying a first dicing mark from the first wafer;

saving a first pattern of the first dicing mark into a database;

automatically measuring a first die pitch of the first wafer; and automatically determining first kerf centers of the first wafer; and after the first wafer is diced, dicing a second wafer identical to the first wafer, wherein the dicing the second wafer comprises:

automatically identifying a second dicing mark from the second wafer by comparing patterns of the second wafer with the first pattern that has been saved in the database;

automatically measuring a second die pitch of the second wafer; and automatically determining second kerf centers of the second wafer.

15. The method of claim 14, wherein:

the dicing the first wafer further comprises manually performing a first leveling process on the first wafer, wherein a second pattern of crossroads of the first wafer is identified; and the dicing the second wafer further comprises automatically performing a second leveling process on the second wafer by comparing patterns of the second wafer with the second pattern.

16. The method of claim 14, wherein an entirety of the dicing the first wafer is performed on a wafer-holding platform of an auto dicing tool.

17. The method of claim 16, wherein an entirety of the dicing the second wafer is performed on the wafer-holding platform of the auto dicing tool.

18. A method comprising:

finding a plurality of dicing marks on a first wafer, wherein patterns of the plurality of dicing marks match a pattern in a database;

measuring a channel die pitch of the first wafer according to a first pitch between adjacent two of the plurality of dicing marks;

dicing the first wafer comprising:

manually performing leveling processes and dicing mark teaching processes;

saving patterns of the first wafer into the database, wherein the first wafer is diced based on the channel die pitch; and dicing a second wafer identical to the first wafer, wherein the dicing the second wafer comprises:

automatically performing leveling processes; and automatically finding dicing marks on the second wafer using patterns of the first wafer saved in the database.

19. The method of claim 18, wherein the patterns of the first wafer saved in the database comprise a pattern of an L-mark.

20. The method of claim 18, wherein the patterns of the first wafer saved in the database comprise a pattern of a crossroad.

* * * * *